United States Patent
Nagazumi

[19]

[11] Patent Number: 5,936,461
[45] Date of Patent: Aug. 10, 1999

[54] CHARGE DOMAIN SIGNAL FILTER

[75] Inventor: Yasuo Nagazumi, 6-10, Meguro 4-chome, Meguro-ku, Tokyo, 153, Japan

[73] Assignees: C.D.S. Co., Ltd.; Yasuo Nagazumi, both of Tokyo, Japan

[21] Appl. No.: 08/873,179

[22] Filed: Jun. 11, 1997

[30] Foreign Application Priority Data

Jun. 13, 1996 [JP] Japan .................................. 8-174266

[51] Int. Cl.⁶ ........................................................ G06F 7/38
[52] U.S. Cl. ..................... 327/552; 327/558; 364/724.12; 364/724.16
[58] Field of Search .................................. 327/552, 558; 364/724.03, 724.12, 724.16

[56] References Cited

U.S. PATENT DOCUMENTS

| | | | |
|---|---|---|---|
| 5,392,042 | 2/1995 | Pellon | 341/143 |
| 5,537,115 | 7/1996 | Nagazumi | 341/172 |
| 5,539,404 | 7/1996 | Nagazumi | 341/150 |
| 5,555,200 | 9/1996 | Chiang | 364/606 |
| 5,634,067 | 5/1997 | Nagazumi | 395/800 |

*Primary Examiner*—Timothy P. Callahan
*Assistant Examiner*—Tuan T. Lam

[57] ABSTRACT

The object of the present invention is to obtain a charge domain signal filter by composing an digital filter circuit with analog/digital mixed circuit and by introducing the analog processing into the process of multiplication and addition consuming the most of the electric power so as to reduce the total power consumption. The present invention is composed of at least one AD converter; at least one reference charge supply unit; a coefficient supply unit for supplying coefficient signals; a plurality of DA converters acting in a charge domain for receiving digital signal outputs supplied from said AD converter and said coefficient signal supply unit, and for performing the multiplication type DA conversion using, as a reference signal, a reference charge packet generated by said reference charge supply unit; and one circuit of analog shift register composed of N stages of charge transfer devices.

10 Claims, 19 Drawing Sheets

CHARGE DOMAIN SIGNAL FILTER

BACKGROUND OF THE INVENTION

1. Field of the Invention

The present invention relates to a charge domain signal filter applicable to a communication apparatus or a signal processing unit.

2. Description of the Prior Art

Heretofore, digital signal processing technology represented by DSP, as shown by the composition of digital filter system illustrated in FIG. 19 has been made an extremely great progress in terms of its processing speed and resolution according to a rapid progress of MOS semiconductor integrated circuit technology.

However, needs for higher level operations using circuits with increased complexity have provoked new problems such as increase of power consumption or device heat generation and, combined with technical needs such as miniaturization or portability, the development of new technical approaches is strongly required.

Revaluation of analog processing method, utilization of analog circuit of low power consumption where allowed functionally or other trends may be as much aspects of this requirement.

In the past, the analog processing has been considered generally "to be low in accuracy, hard to realize integrated circuits and often requiring a large circuit area"; however, some analog circuits are proposed for the operation circuit acting in charge domain wherein the power consumption is low and, moreover, the same function may be ensured by a circuit substantially smaller than the digital circuit in some applications, thus representing as much examples of new technological approaches meeting with such trends.

Conventionally, inventions concerning such apparatus are disclosed in U.S. patent application Ser. No. 08/344,650, U.S. Pat. No. 5,539,404 or U.S. Pat. No. 5,537,115.

On the other hand, conventional digital filters have been proposed in 4 typical compositions shown in FIGS. 20 to 23.

FIG. 20 shows the composition of a filter of the type called FIR (Finite Impulse Response Type) without using feedback from output signal, FIG. 21 shows the composition of a filter of the type called IIR (Infinite Impulse Response Type) using feedback from output signal, and FIG. 22, FIG. 23 respectively represents the composition of filter combining them.

All these compositions are designed to perform the digital processing and, when analog signal input/output is necessary, require naturally AD converter and DA converter before and behind the input/output terminal but they are not shown.

The object of the present invention is, therefore, to provide a charge domain signal filter by recomposing with analog/digital mixed circuit the digital filter circuit that has been composed mainly of DSP such as FIR or IIR and introducing analog processing into the process of multiplication and addition consuming the most part of the power so as to reduce the total power consumption.

SUMMARY OF THE INVENTION

The present invention has been made to resolve such problems and intends to provide a charge domain signal filter comprising:

at least one AD converter;

at least one reference charge supply unit;

a coefficient supply unit for supplying a coefficient signal;

a plurality of DA converters acting in a charge domain for receiving digital signal outputs supplied from said AD converter and said coefficient signal supply unit and for performing a multiplication type DA conversion using, a reference charge packet generated by said reference charge supply unit as a reference signal; and an analog shift register composed of N stages of charge transfer devices.

DETAILED EXPLANATION OF THE PREFERRED EMBODIMENTS

Now, the composition of one embodiment of the present invention will be described referring to the annexed drawings.

FIGS. 1 to 4 show the composition of the embodiment of the present application composed in correspondence to FIGS. 20 to 23 showing prior arts.

In FIGS. 1 to 4, R, R' indicate a reference charge supply unit, C a digital type coefficient signal supply unit, T and + row an analog shift register and MDAC a multiplication type DA converter operating in charge domain respectively.

Now, referring to FIG. 1, the operation sequence may be described as follows:

(1) A set of an input charge signal X (n) is, first, AD converted in reference to the reference signal from the reference charge signal supply unit R' and supplied to N+1 MDACs as digital input.

(2) In each MDAC, DA conversion is performed using the reference signal from the reference charge supply unit R respectively and n duplicates of an input charge signal are synthesized.

(3) Then, respective MDACs perform an multiplication type DA conversion with coefficient signal a0, a1, a2 . . . , aN supplied separately from the digital type coefficient signal supply unit C using thus said synthesized duplicate signal as reference signal, and form an output signal.

(4) These results are added in the charge domain on the analog shift register circuit and shifted in the illustrated direction.

(5) By reiterating steps above mentioned n times, convolution results between the set of input charge signal X (n) and the coefficient signal group (a0~aN) are output one after another, as output Y (n), at the last stage of the shift register.

Though in the operation procedure shown above, first the duplicate signal of the input charge is composed in said step (2), based on the commutative law of multiplication, the order of said steps (2) and (3) may naturally be exchanged to obtain the same result.

When the multiplication of the AD conversion output and the coefficient signal may also be digitally performed in advance before inputting to the MDAC, the same result is exactly obtained also.

Figure 1:
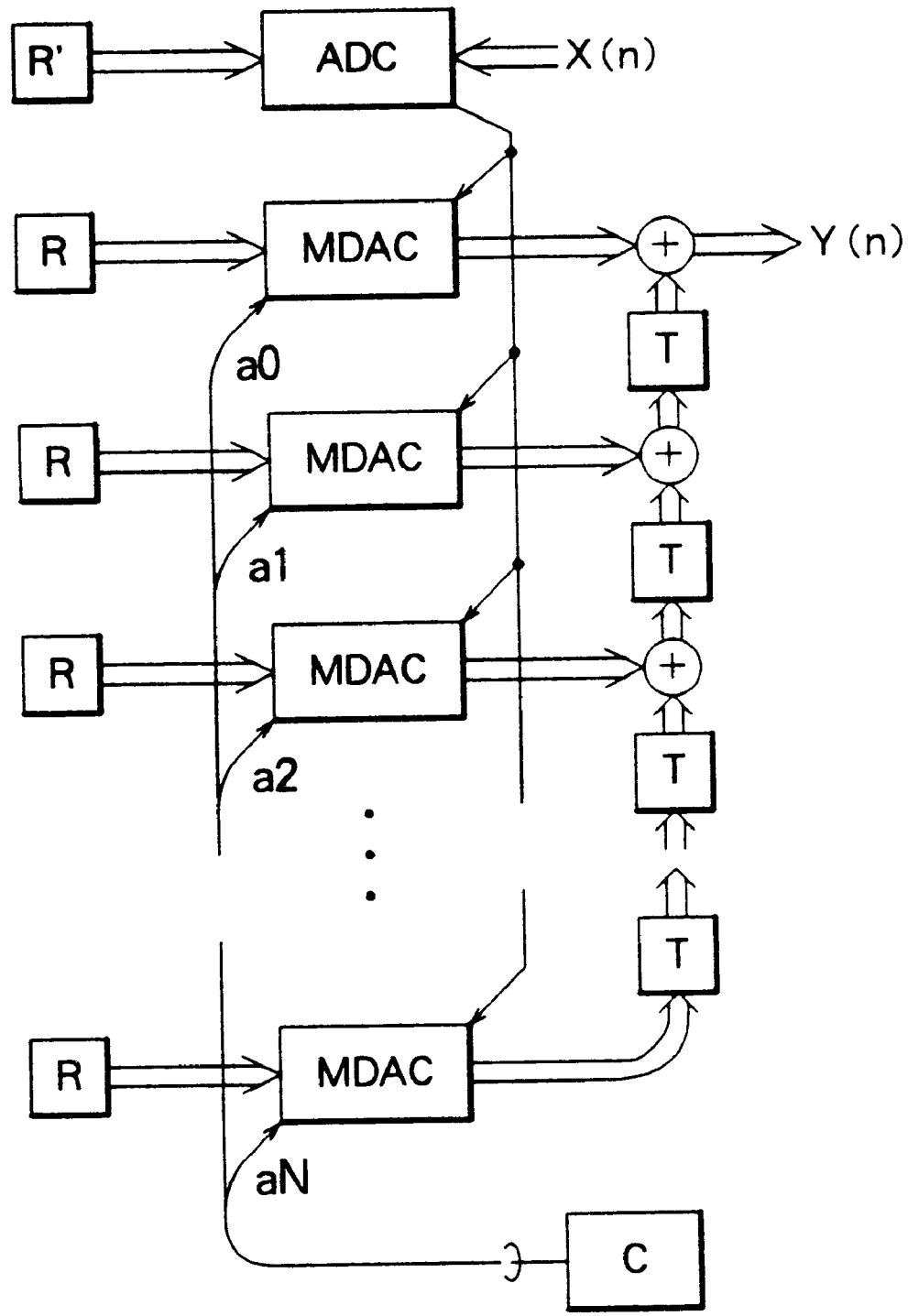
FIG. 1 is a basic composition drawing showing an embodiment of the present invention.
Figure 2:
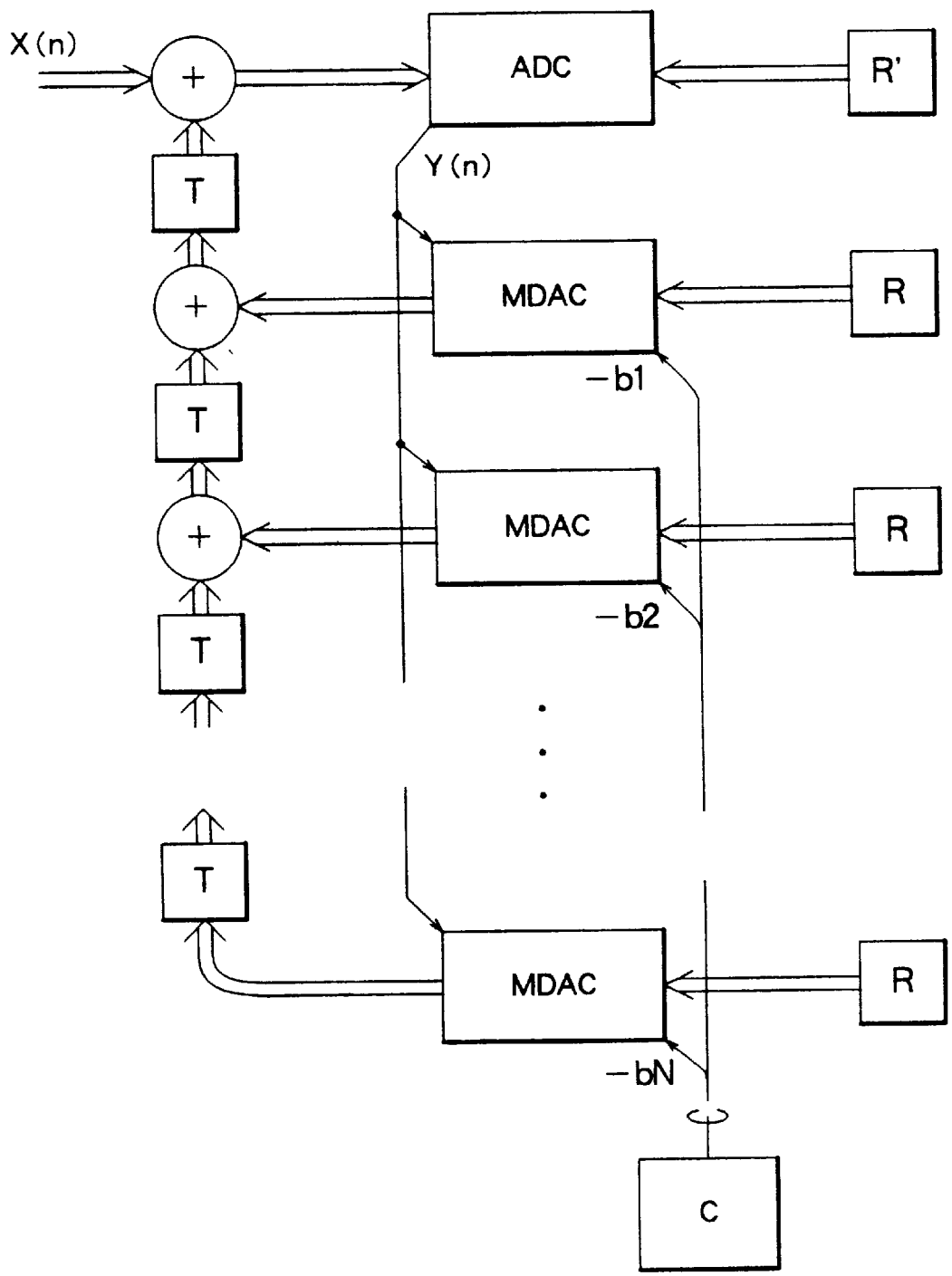
FIG. 2 is a basic composition drawing showing another embodiment of the present invention.

As it is obvious from the comparison with FIG. 1, the operation principle of FIG. 2 is exactly same as FIG. 1 except that the feedback path is set so as to obtain input to the AD converter by adding the input signal and the output signal.

Figure 3:
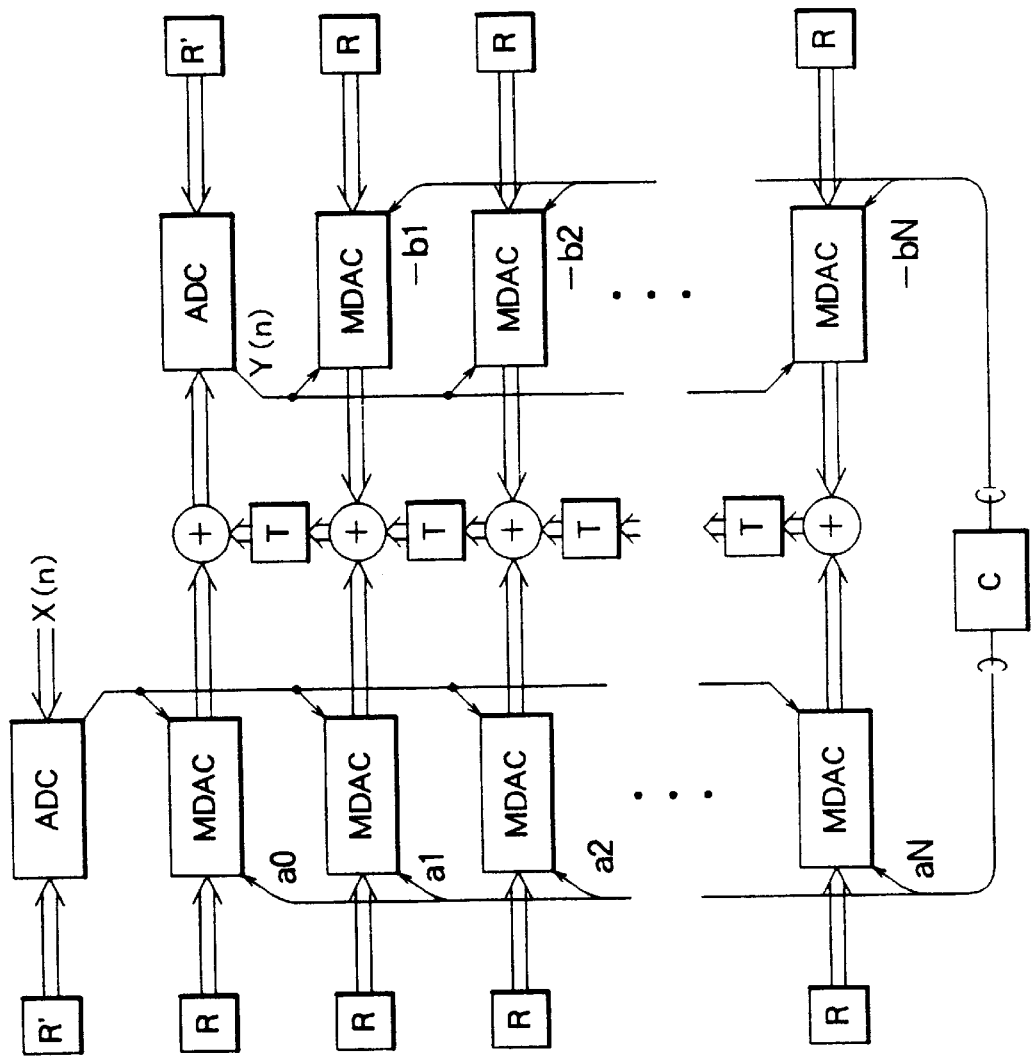
FIG. 3 is a basic composition drawing showing still another embodiment of the present invention.
Figure 4:
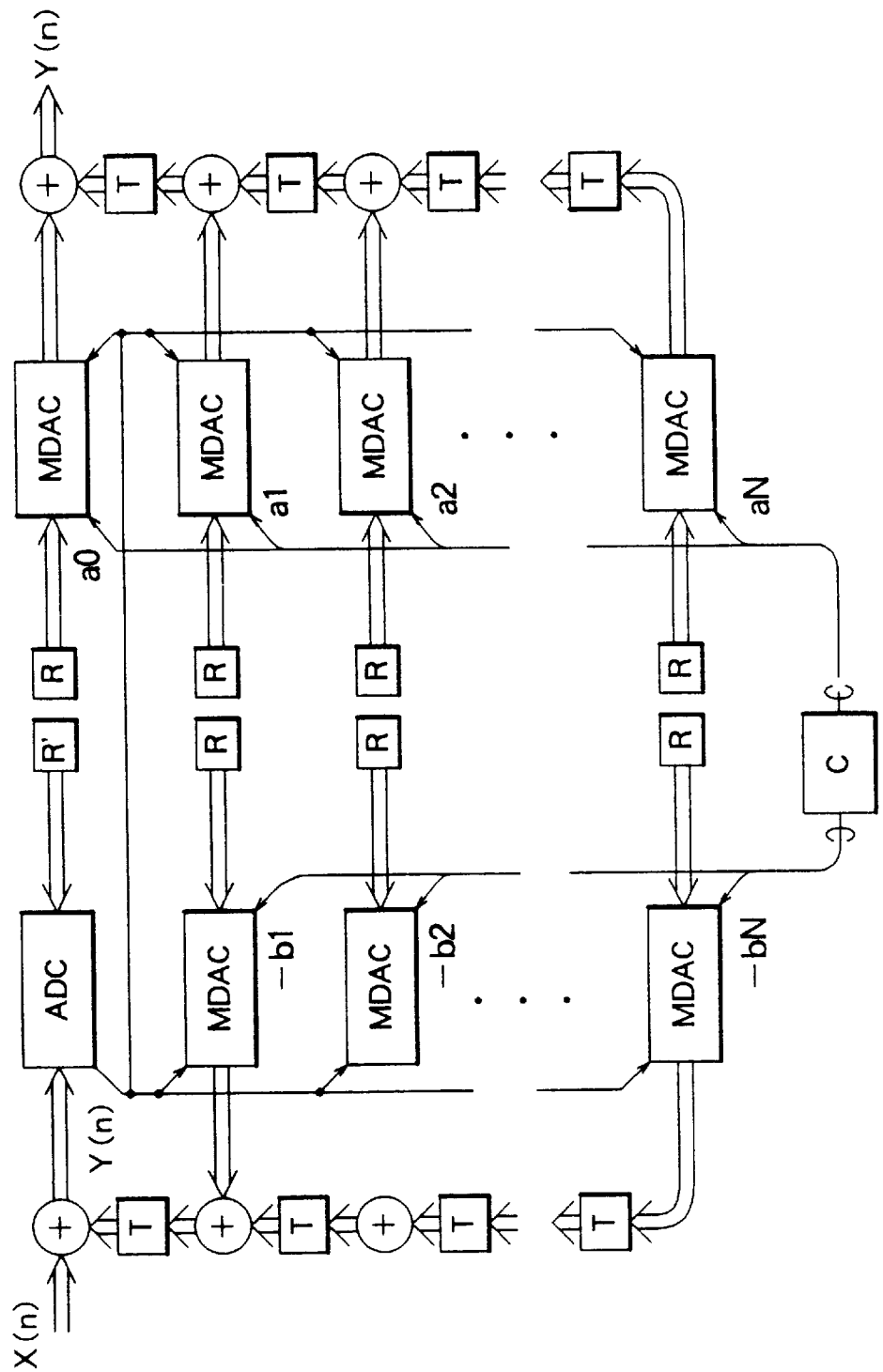
FIG. 4 is a basic composition drawing showing still another embodiment of the present invention.

In the example of FIG. 3, said FIGS. 1 and 2 are connected in common at the last stage of the shift register and, in the example of FIG. 4, said FIGS. 1 and 2 are connected with their reference charge signal supply unit group back to back. Their operation principle is exactly same as FIG. 1.

Figure 5:
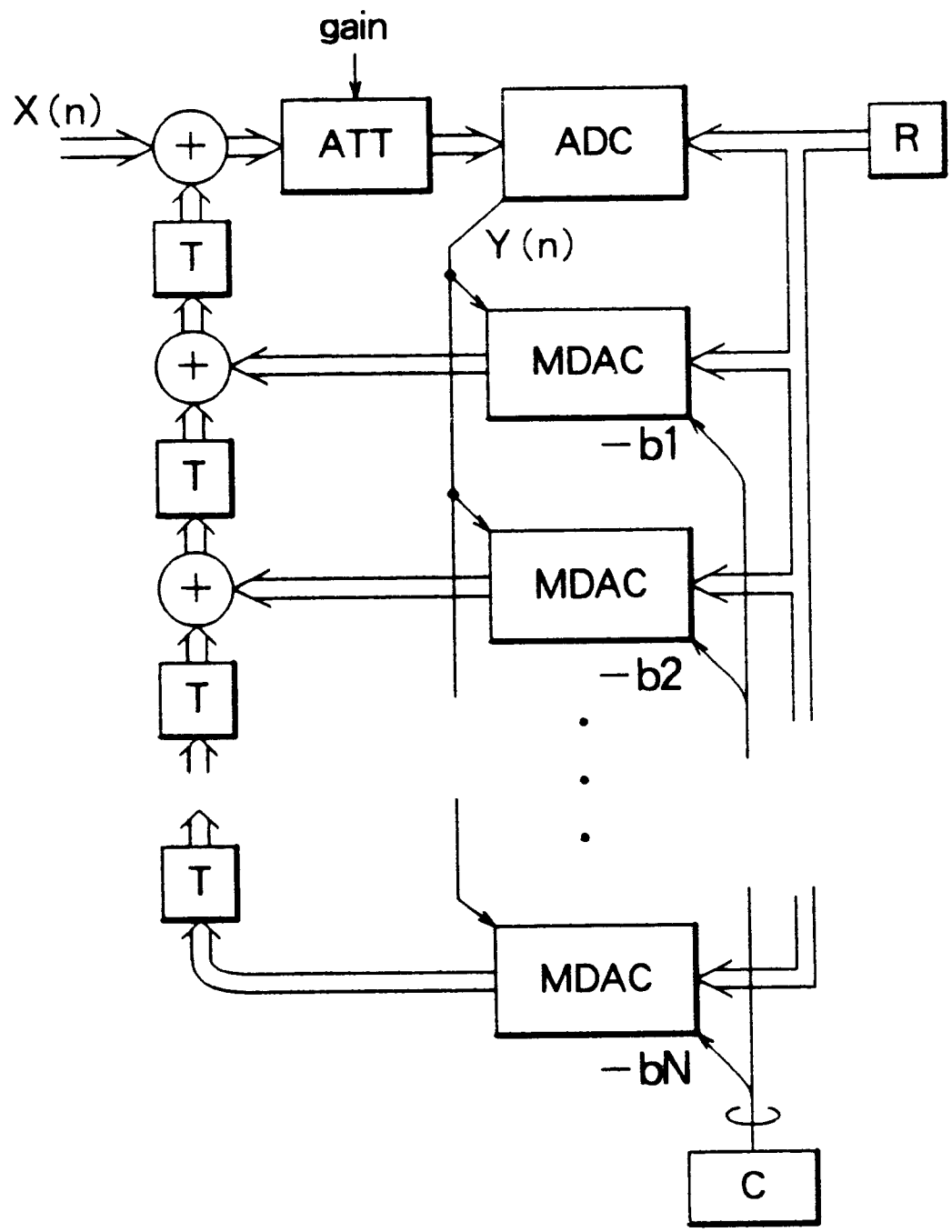
FIG. 5 is the composition of an example wherein the reference charge supply unit of FIG. 2 is all made common and, moreover, a charge signal attenuation unit is added to the input signal of the AD conversion unit.

In FIG. 5, the reference charge supply unit of the composition of FIG. 2 are all put in common and, moreover, a charge signal attenuation unit ATT is added to the input signal of the AD conversion unit.

Thus, by putting in common all reference charge supply units, global operation accuracy may remarkably be improved through the unification of the reference signal in the system, but on the other hand, excessive loop gain caused by the difference in number of the AD converter and the DA converter tends to provoke a system operation diversion so as to require some signal attenuation means in the loop.

In FIG. 5, as one of such solutions, a charge signal attenuator is disposed at the input stage of the AD converter; however, the same effect may naturally be achieved, for example, by the shift operation of output digital signal bit of the AD converter.

When an AD converter composed of charge transfer device is used, same gain adjustment may naturally be achieved by adjusting output packet size or packet number ratio of the reference charge generation unit R for the DA converter in respect to output packet size or packet number of the reference charge signal generation unit R' for the AD conversion.

Figure 6:
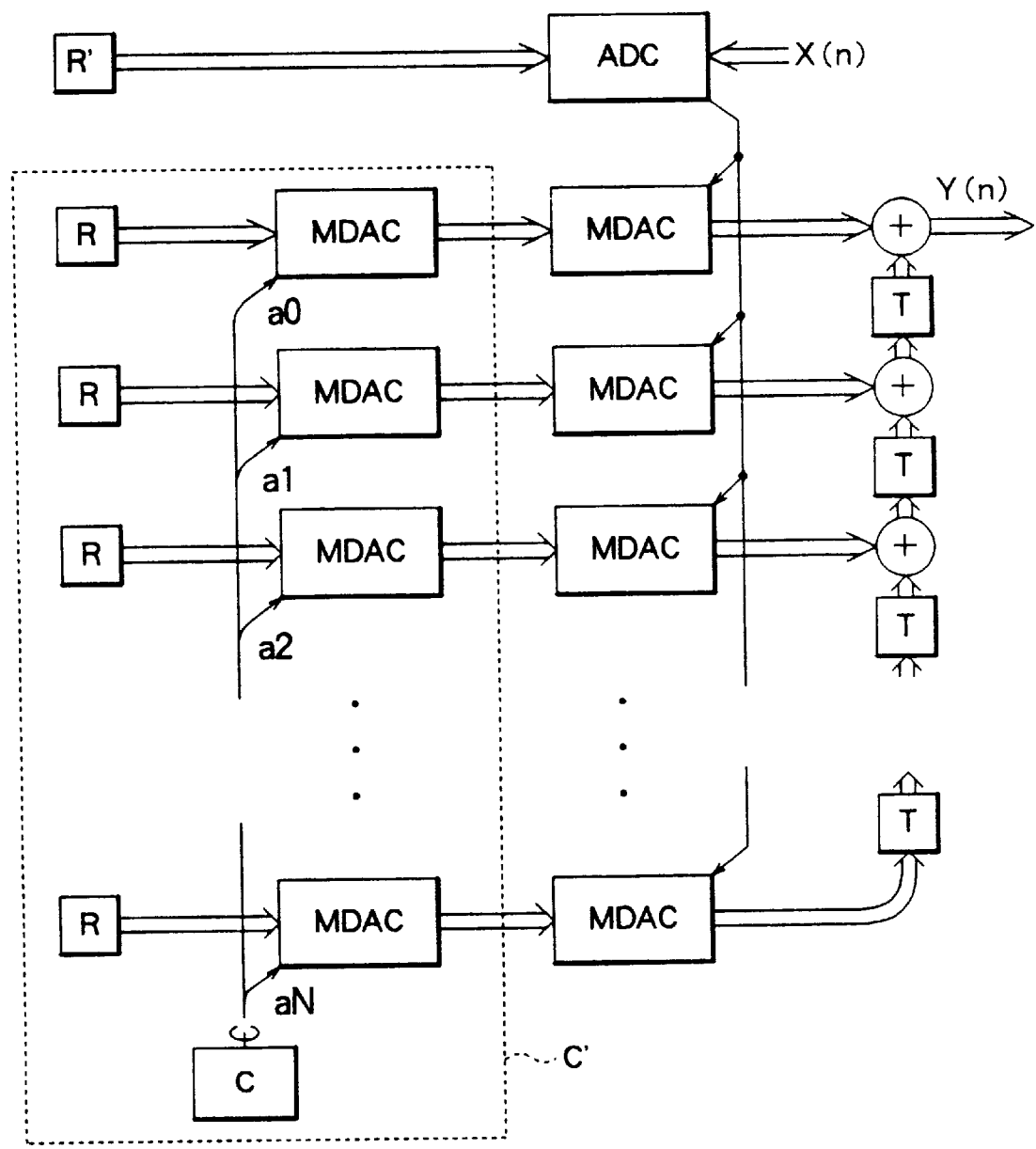
FIG. 6 is the composition of an example wherein higher speed operation is realized with pipeline processing, by disposing respectively 2 of each MDAC of the composition shown in FIG. 1 of the present invention.

FIG. 6 shows an example of pipeline composition wherein respective MDACs of one MDAC group composing FIG. 1 are substituted with two, first and second, MDACs serially connected for enabling signal processing at a higher rate.

In this example, aforementioned operation processes (2) and (3) are performed by two MDAC groups, while a section indicated with broken line integrating a reference charge generator R and one of the MDAC groups forms an analog type coefficient signal delivery apparatus C'.

In the example of FIG. 6, when a coefficient signal ai takes a positive or a negative value, the output charge signal from the first MDAC should also represent a positive or a negative value signal and it is required to represent by a differential output composed, for instance, of two charge signal packets.

In this case, about 2 times of operation time are required as the second MDAC should process two charge signals output from the first MDAC for performing four quadrant multiplication.

Figure 7:
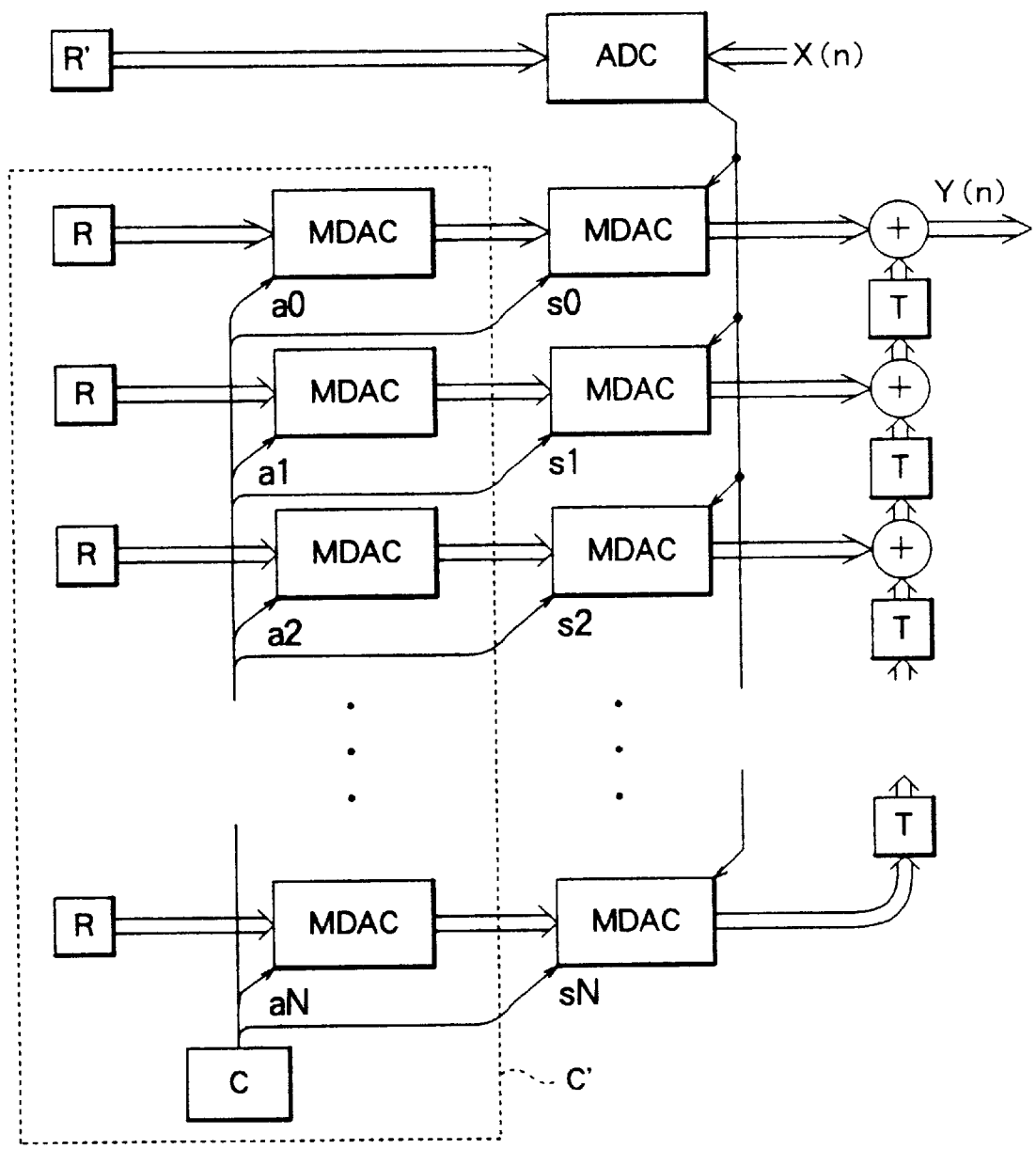
FIG. 7 is the composition of an example using two quadrant MDAC as structural element of the present invention.

FIG. 7 shows a mode wherein, to solve this problem, a coefficient digital signal is divided into a sign bit Si and an absolute value section to supply the first MDAC with the absolute value section and the second MDAC separately with the sign bit.

In this case, as the output from the first MDAC is always a positive signal, the number of output charge signal is one; as the consequence, the second MDAC acting upon reception of this output requires only two quadrant multiplication.

Here, the sign bit Si delivered to the second MDAC is used for controlling the polarity of the output signal from the second MDAC by, for instance, multiplying by the input signal delivered from the ADC to respective second MDAC through digital operation or by other methods.

As the consequence, the required operation time is all the more shortened than the composition of FIG. 6, because the second MDAC performs only two quadrant operation.

Figure 8:
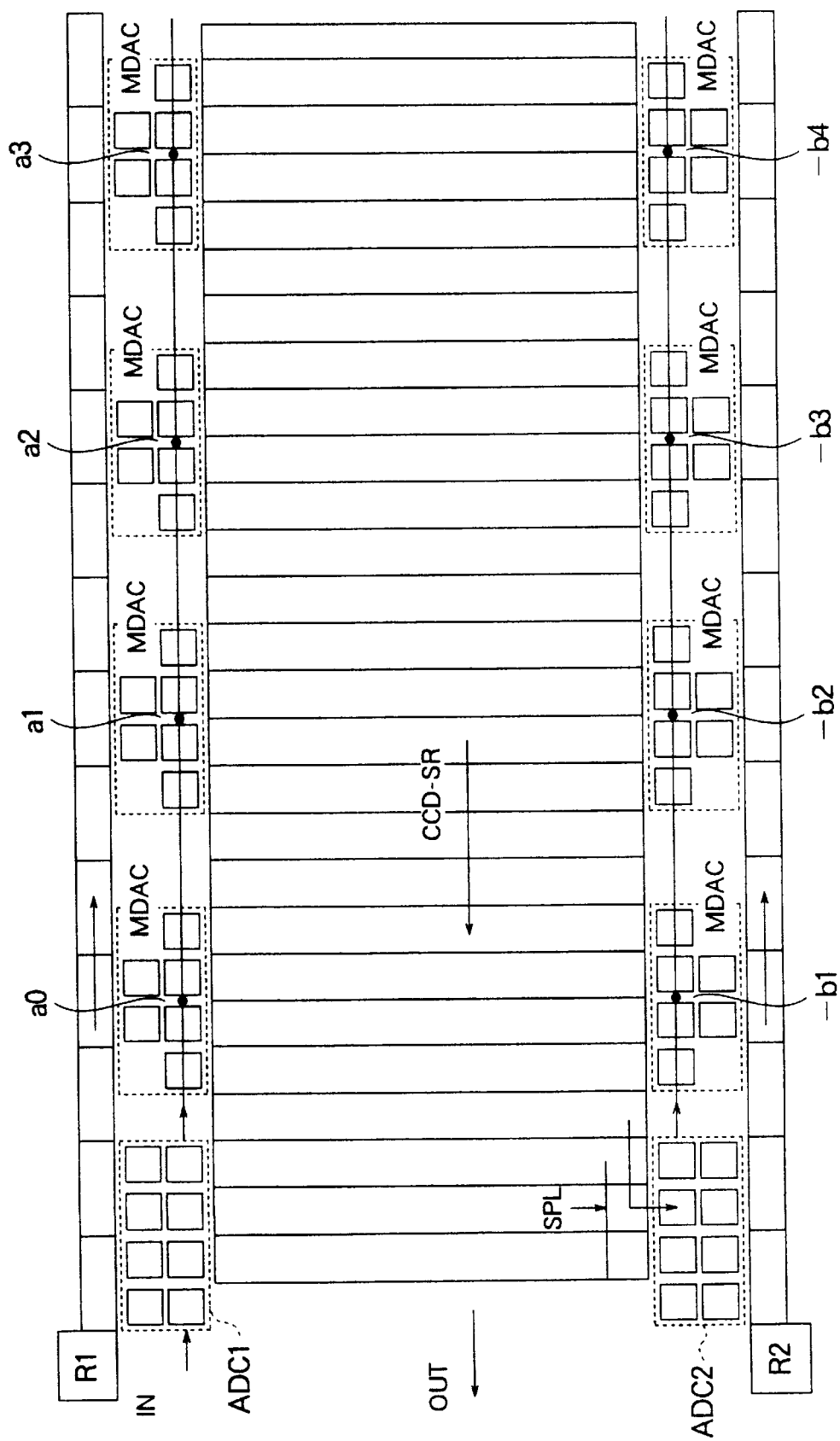
FIG. 8 is the composition of an example using charge-coupled device in the composition of FIG. 3 of the present invention.
Figure 9:
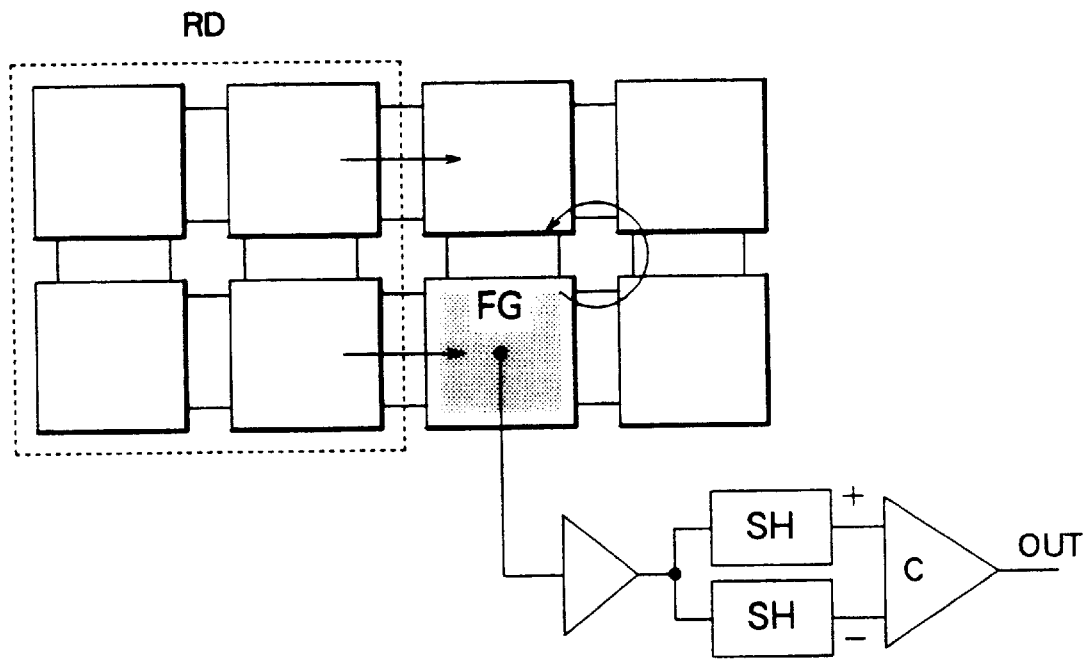
FIG. 9 is a composition drawing showing the detail of ADC, structural element, of the present invention.
Figure 10:
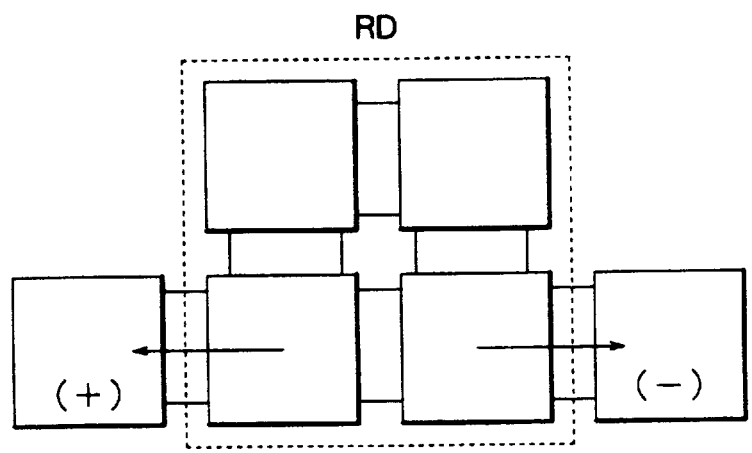
FIG. 10 is a composition drawing showing the detail of MDAC, structural element, of the present invention.

FIG. 8 represent an embodiment wherein the composition of FIG. 3 is materially realized by using the charge-coupled device CCD; the detail of the ADC and the MDAC used in the drawing is as shown in FIGS. 9 and 10.

Figure 11:
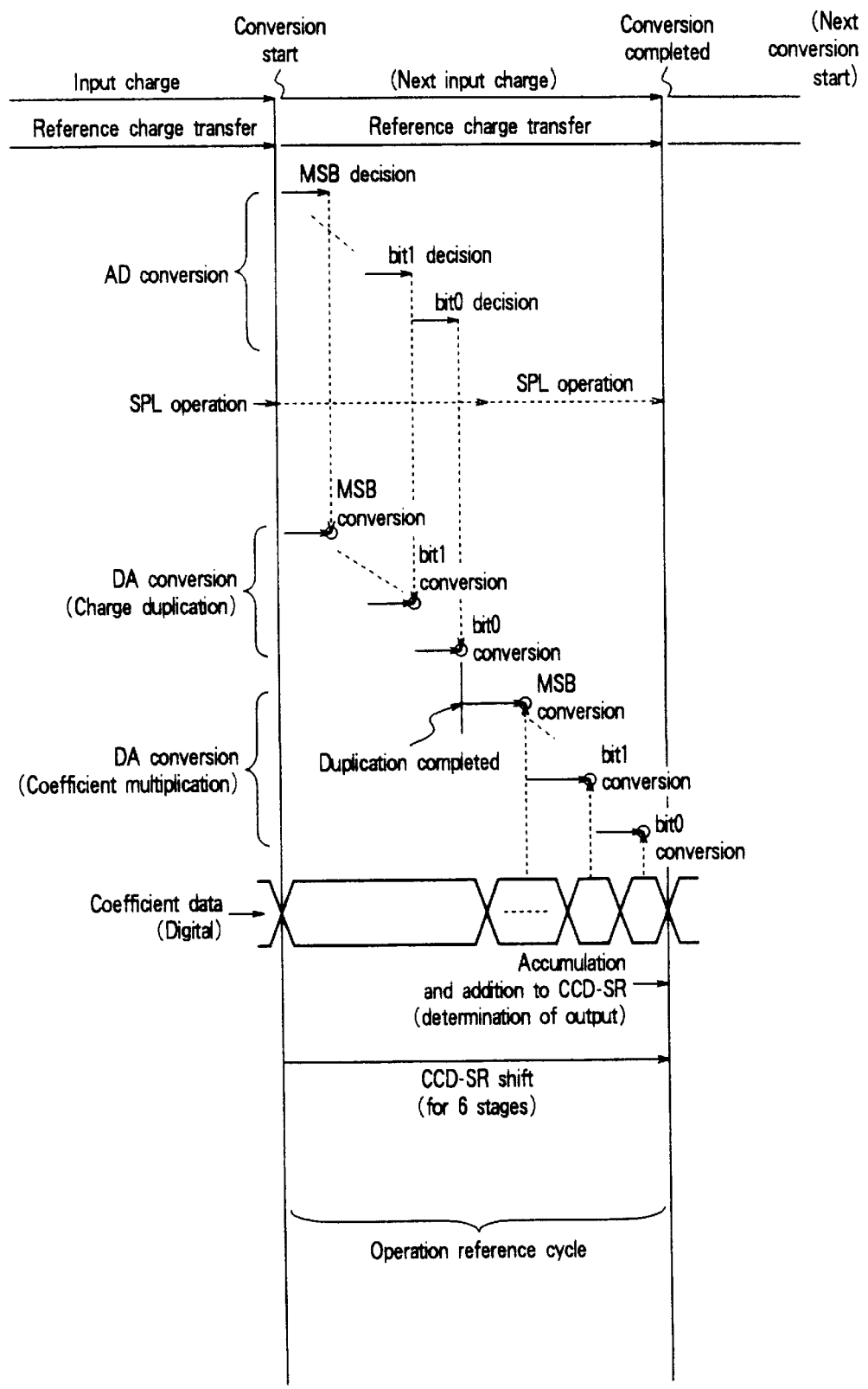
FIG. 11 is an illustration the operation sequence of FIG. 8.

FIG. 11 shows the operation sequence of this apparatus.

Figure 12:
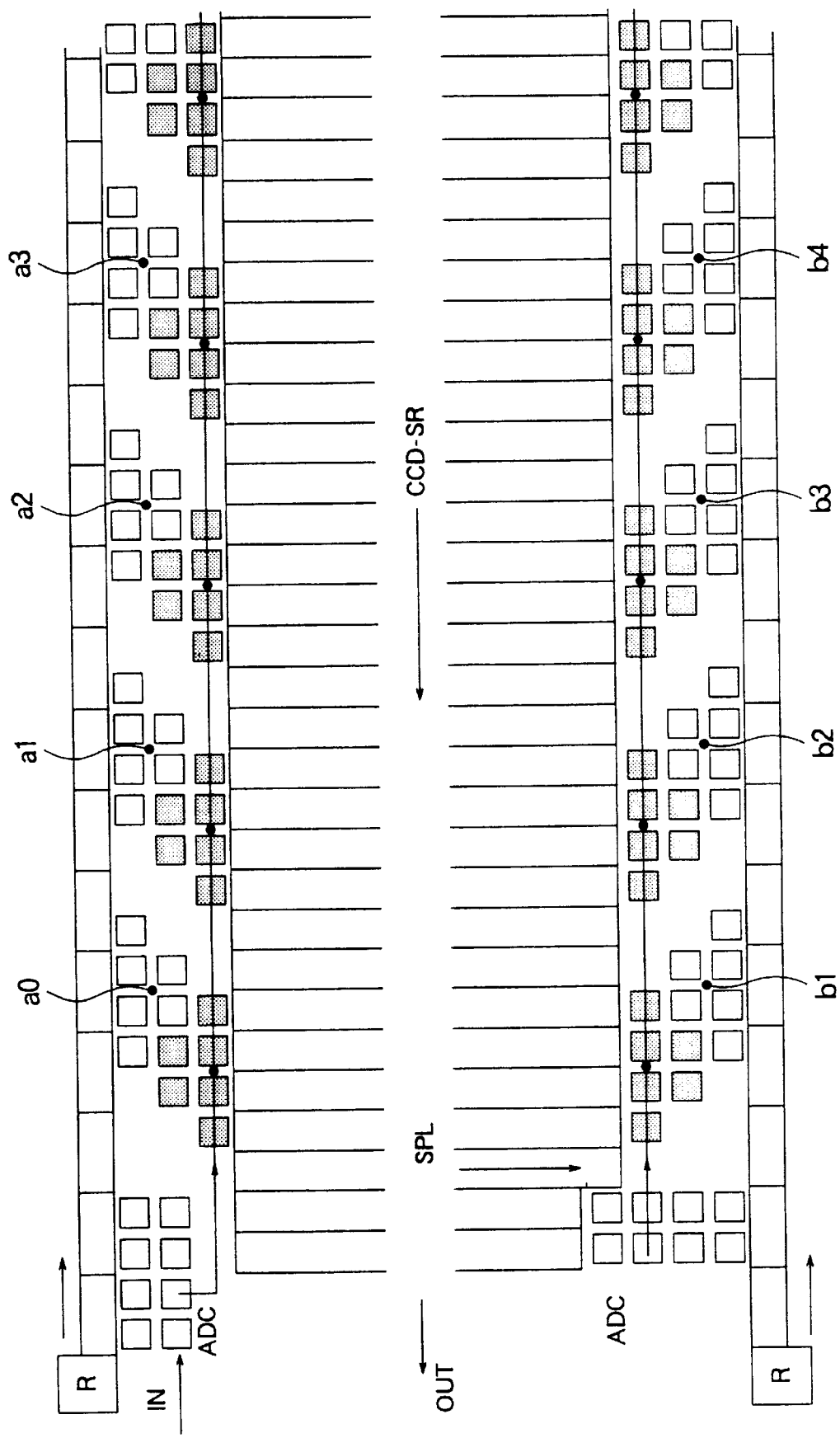
FIG. 12 is a composition diagram showing another embodiment using the composition of FIG. 7 for higher speed operation.

FIG. 12 shows another embodiment adopting the composition described in FIG. 7 for the higher speed operation of the composition of FIG. 8.

In FIG. 12, the hatched MDAC represents the MDAC of FIG. 8 and, in this embodiment, another MDACs are added by one respectively; so the reference charge signal supplied from the reference charge generation unit R is first multiplied by the coefficient signal ai, bi in this another MDAC.

This output signal is supplied to the adjacent hatched MDAC and, there, multiplied by the input digital signal supplied from ADC. As these operations may be performed as pipeline operation, the operation essential cycle may be reduced to the half of the case shown in FIG. 11 and the operation speed approximately doubled.

Figure 13:
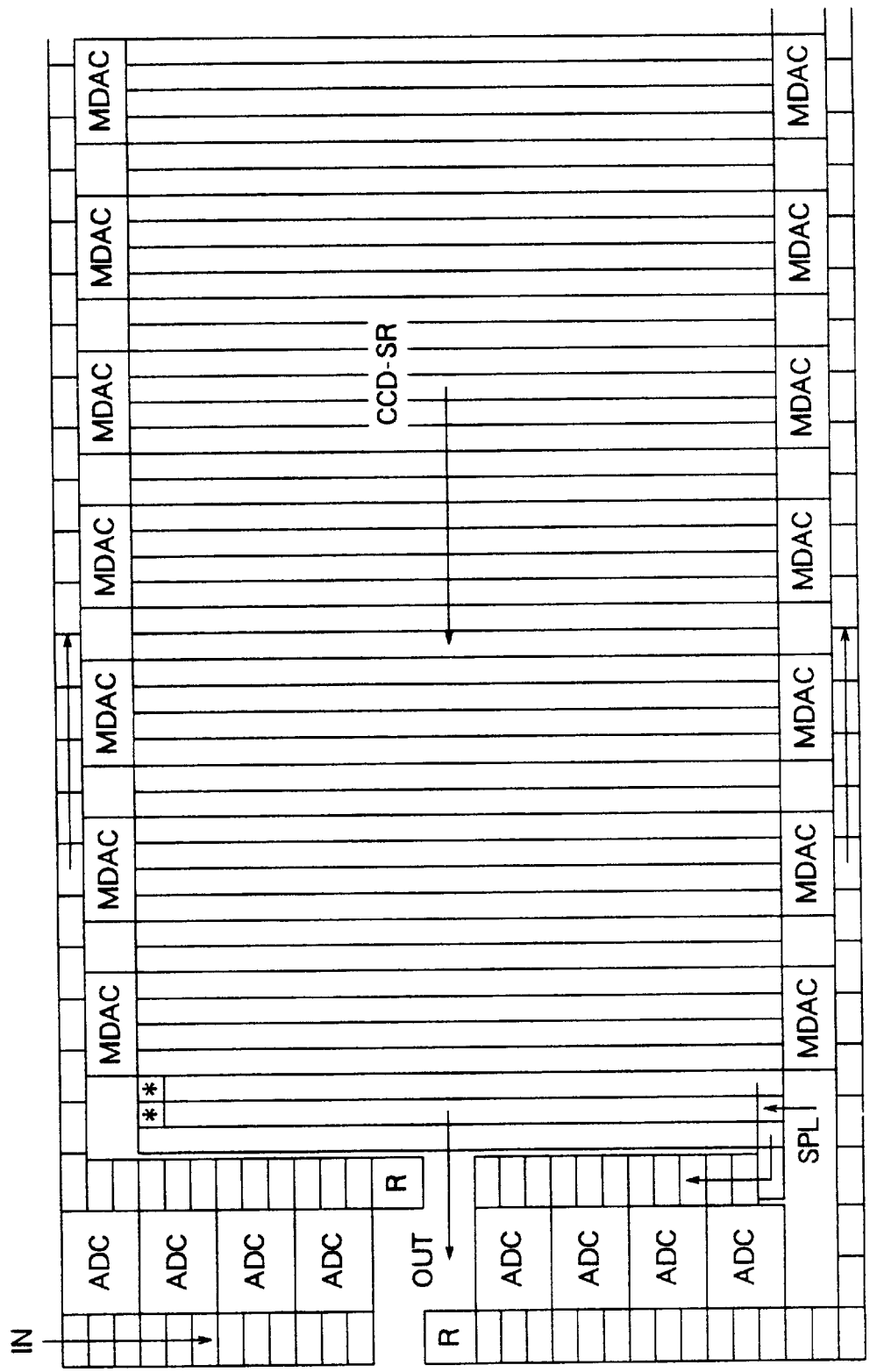
FIG. 13 is a composition diagram showing an example of decimation type filter enabling higher speed processing all the way preserving the parallel composition of FIG. 8 as it is.

FIG. 13 shows a decimation type filter enabling a higher speed processing by making the composition of FIG. 8 parallel composition as it is.

In FIG. 13, a plurality of AD converters decide the digital signal bit of the input signal IN supplied through the analog shift register circuit in reference to the reference charge signal supplied separately from the reference charge signal supply unit and deliver to the MDAC group whereas the MDAC group duplicates the signal in reference to the reference charge signal supplied separately in the same manner according to this signal.

In the next stage, these duplicate signals are used as reference signal in the same MDAC, multiplied by the coefficient data bit (not shown) supplied respectively from outside and the output signal charge thereof is accumulated and added in the charge domain on the CCD-SR disposed adjacently so as to form the output signal OUT sequentially.

In the composition of this FIG. 13, even if sufficient processing speed may not be obtained by a single AD conversion unit, the processing may be enabled through the improvement of global throughput by the cooperative operation of a plurality of AD conversion units.

In FIG. 13, a dynamic type splitter SPL is provided composing a charge attenuator for the size adjustment of the ADC input charge signal as shown in FIG. 8; however, as the charge division ratio of this splitter is an important factor giving a great influence on the system operation accuracy, in the example of FIG. 13, an adjustment electrode is disposed at the position marked by * an adjustment electrode for adjusting the division ratio.

This electrode performs the charge transfer as other adjacent charge transfer electrodes, but its operation voltage or the timing may be controlled separately so as to permit to fine control from the outside the potential well depth or profile under the electrode in the process of the charger transfer.

This composition may used very effectively in case where a significant error of the splitter SPL is produced in the process of the circuit manufacturing.

Figure 14:
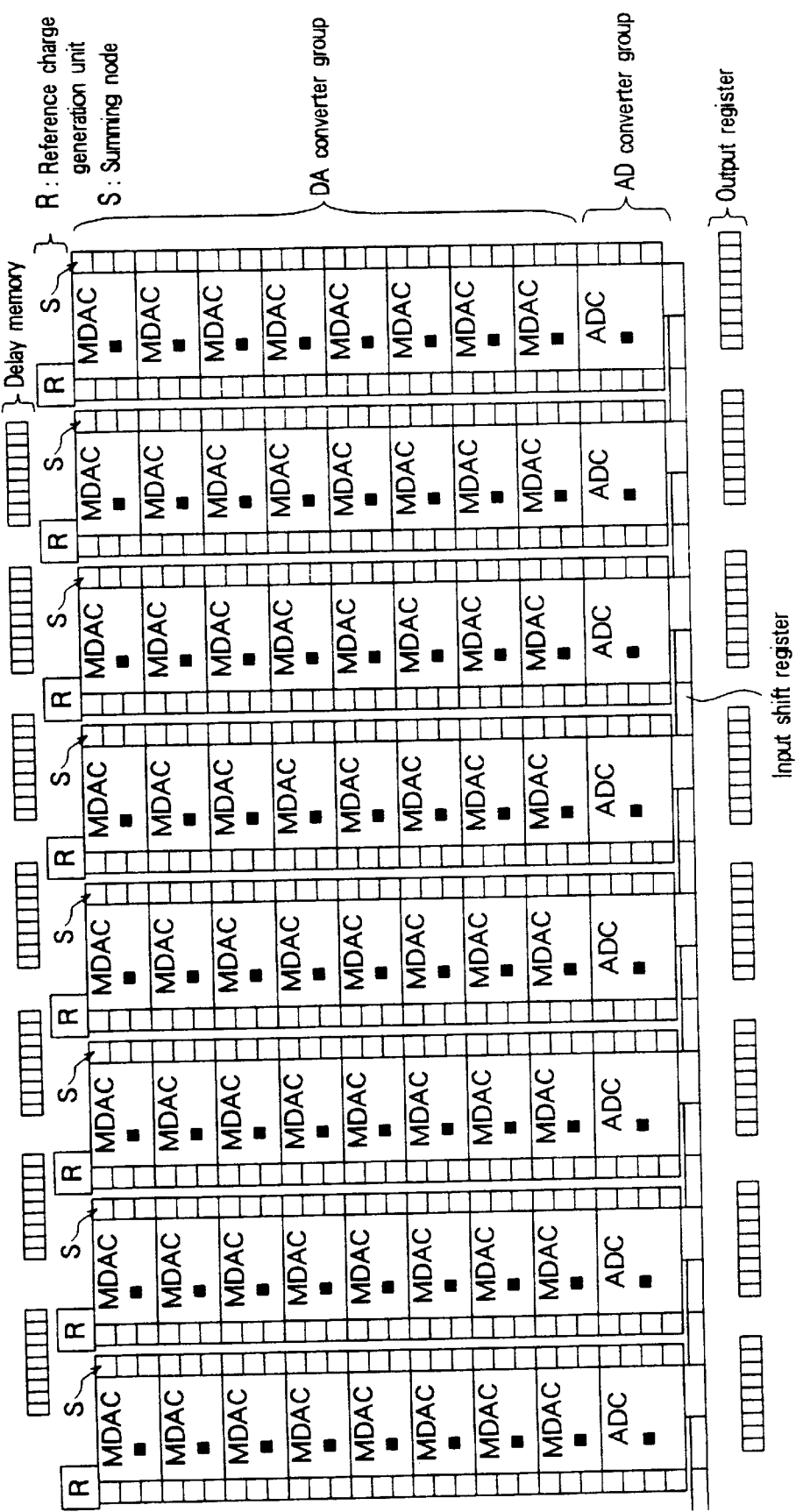
FIG. 14 is a composition diagram showing another example of decimation type filter enabling higher speed processing all the way preserving the parallel composition of FIG. 8 as it is.

FIG. 14 shows an embodiment of another parallel composition. In this embodiment, MDACs are disposed two-dimensionally in order to realize the higher parallelization.

Figure 15:
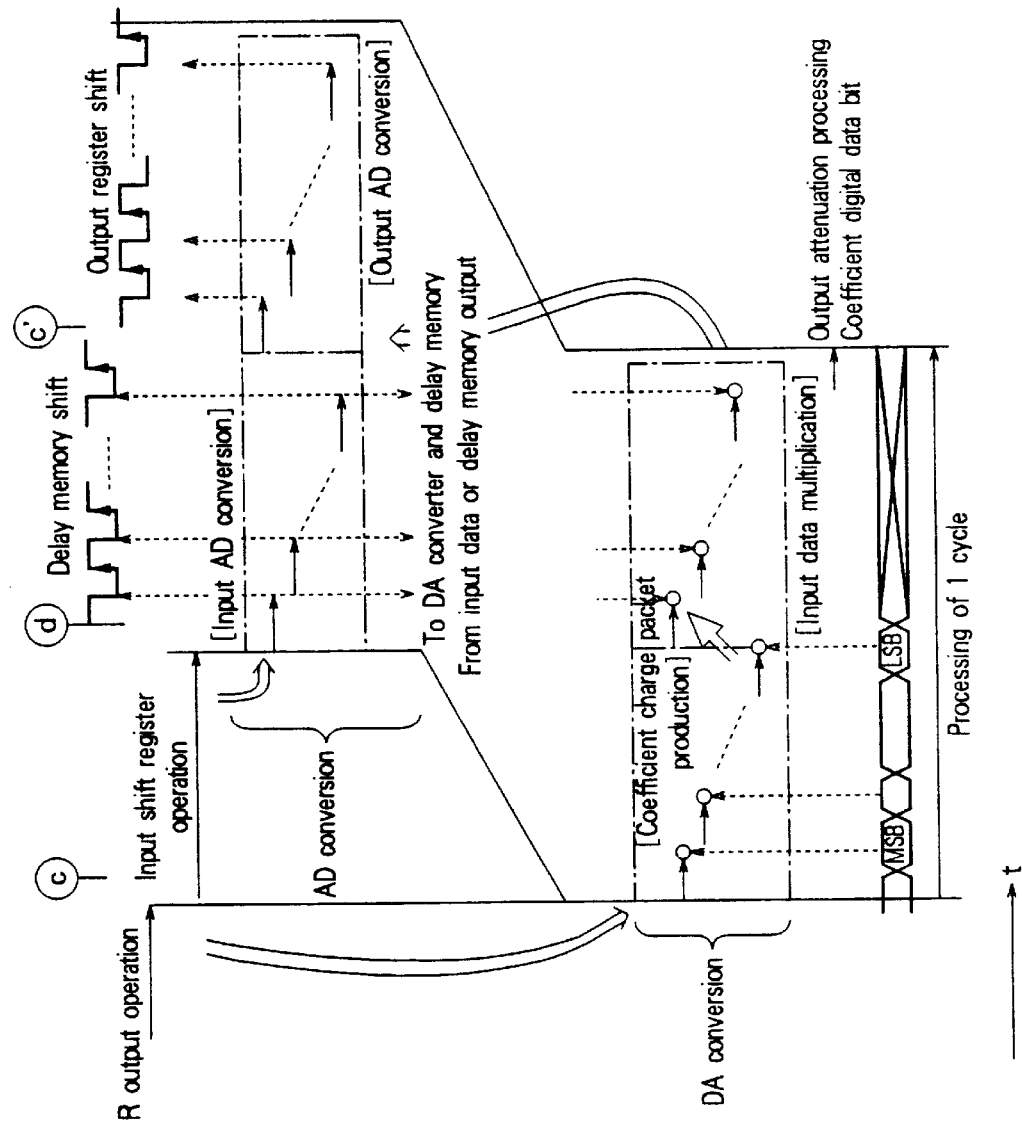
FIG. 15 is an illustration showing procedure of operations of FIG. 14.

The operation procedure of this apparatus is shown in detail in FIG. 15; different from the example mentioned before, in this example, the input charge signal is not duplicated but the operation begins with the conversion of the coefficient signal to the analog charge signal.

Now the operation thereof will be described in order:

(1) N+2 reference charge packets supplied respectively from the reference charge supply unit are transferred to N DA converters and one AD converter through a CCD register.

Figure 16:
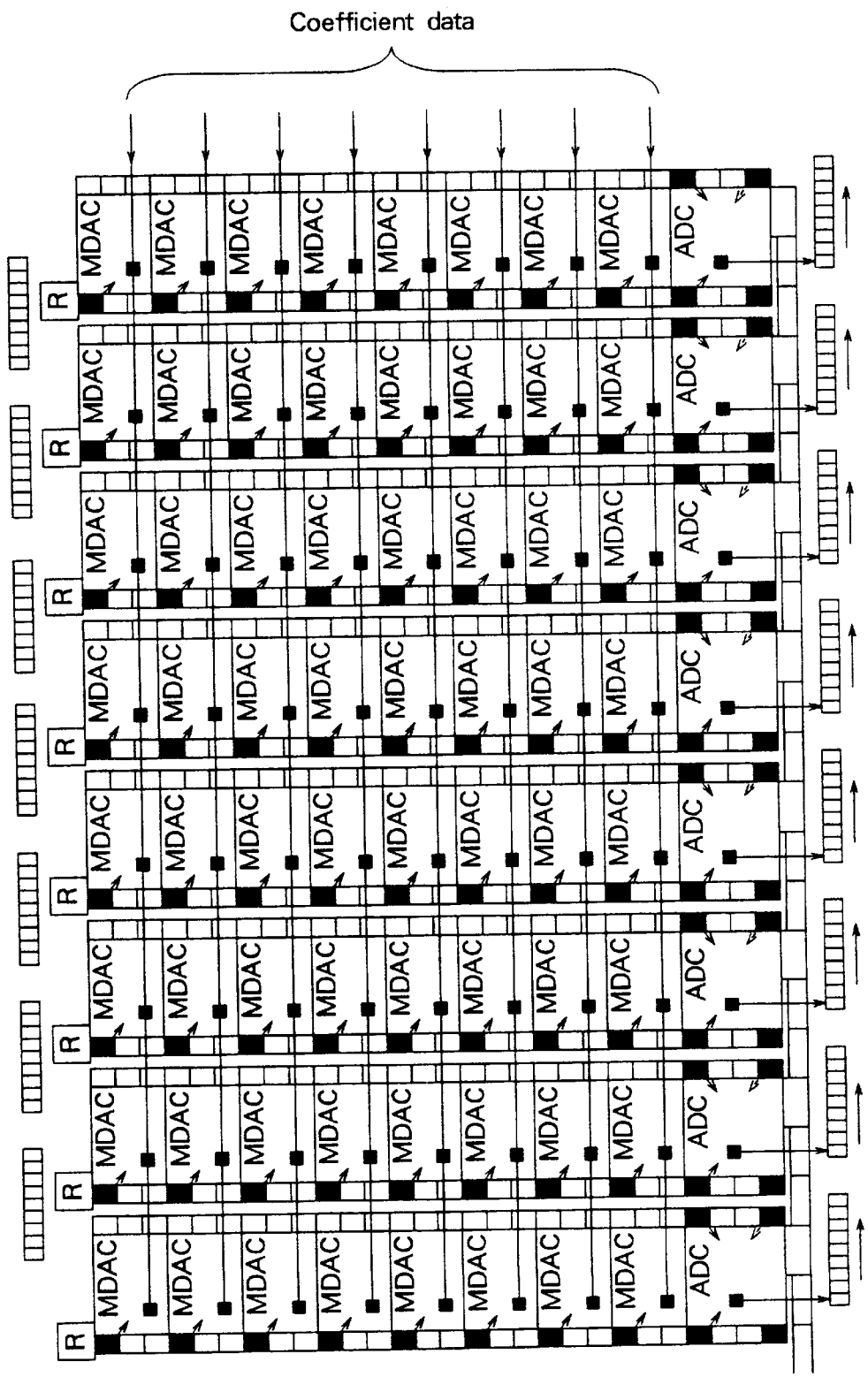
FIG. 16 is a composition diagram showing the state of conversion by the DA converter of FIG. 14 from externally supplied coefficient data into analog charge signal using reference charge as reference signal.

(2) Each DA converters converts coefficient data supplied from the outside to the analog signal, as the state shown in FIG. 16, taking these reference signals as reference signal.

While, the AD converter converts the output charge signal of previous operation that has been already processed to the digital signal.

Figure 17:
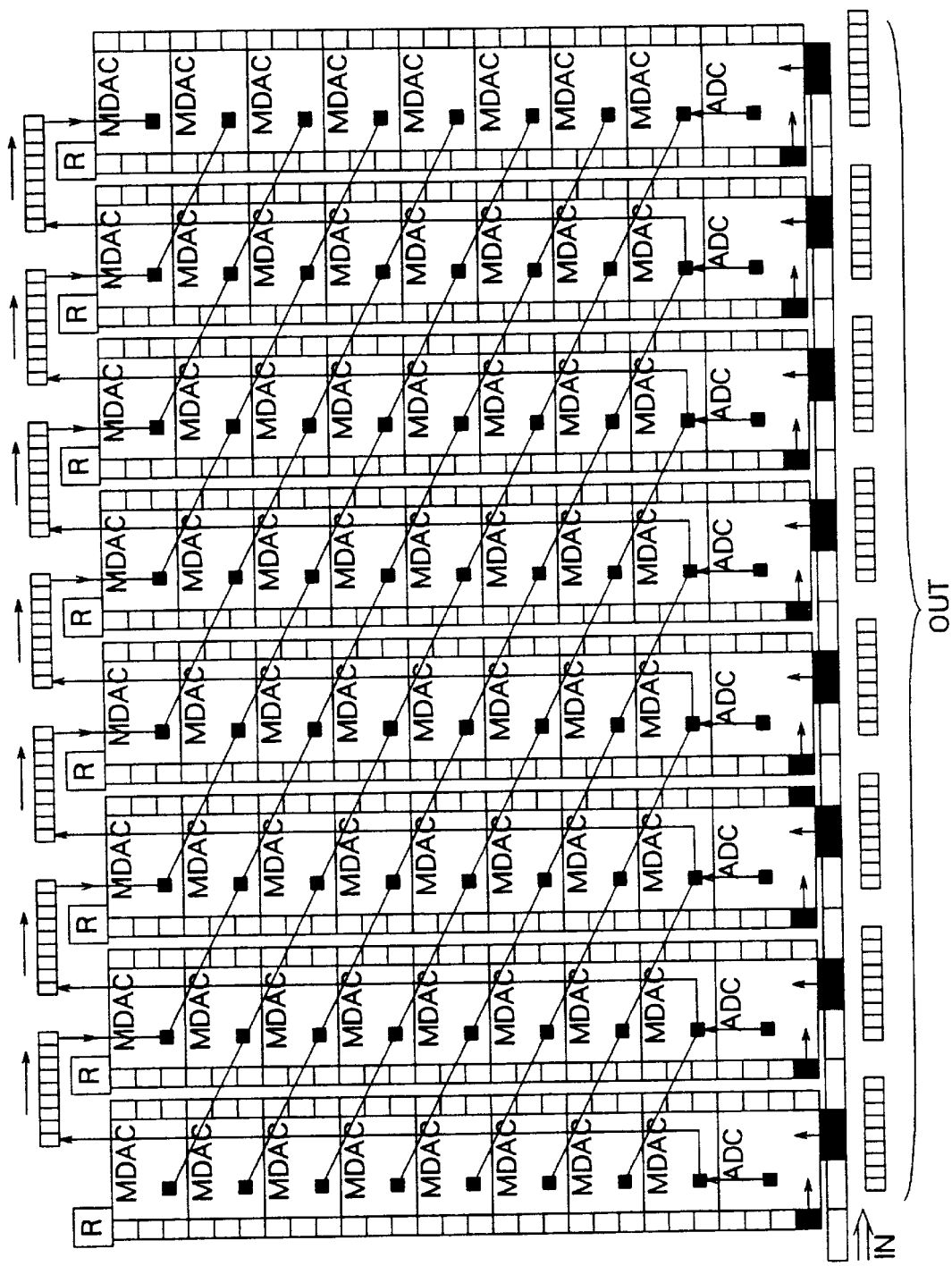
FIG. 17 is a composition diagram showing the state of the AD converter of FIG. 14 receiving input charge packet supplied from the input shift register, converting it to digital signal and delivering digital input signal to certain DA converters that have started the operation in parallel.

(3) Then, the AD converter, as shown in the state of FIG. 17, intakes the input charge packet supplied from the input shift register, converts it to the digital signal and delivers the digital signal to certain DA converters that have began the operation in parallel.

On the other hand, the AD converted output is also input into and stored in parallel by a delay memory which is disposed separately.

The DA converters multiplies the analog charge type coefficient data generated by the processing of said step (2) by the digital input signal.

Here, the digital signal is classified into the two following categories according to its object MDAC:

1. One wherein the AD converter output is taken directly as the digital input signal.
2. One wherein the past AD conversion result is taken as the digital input signal through the delay memory.

Meanwhile, the content of the output register, the output data of the previous operation, is output outside.

(4) The analog output charge computed by the MDAC in the process of said step (3) is summed in a summing node S as shown in FIG. 16, digitized in respective AD converter and stored on the output register.

In this example, the summing node S performs the output attenuation processing as the same time as the summing in order to prevent the operation accuracy from being degraded when the output charge packet size becomes excessive.

Figure 18:
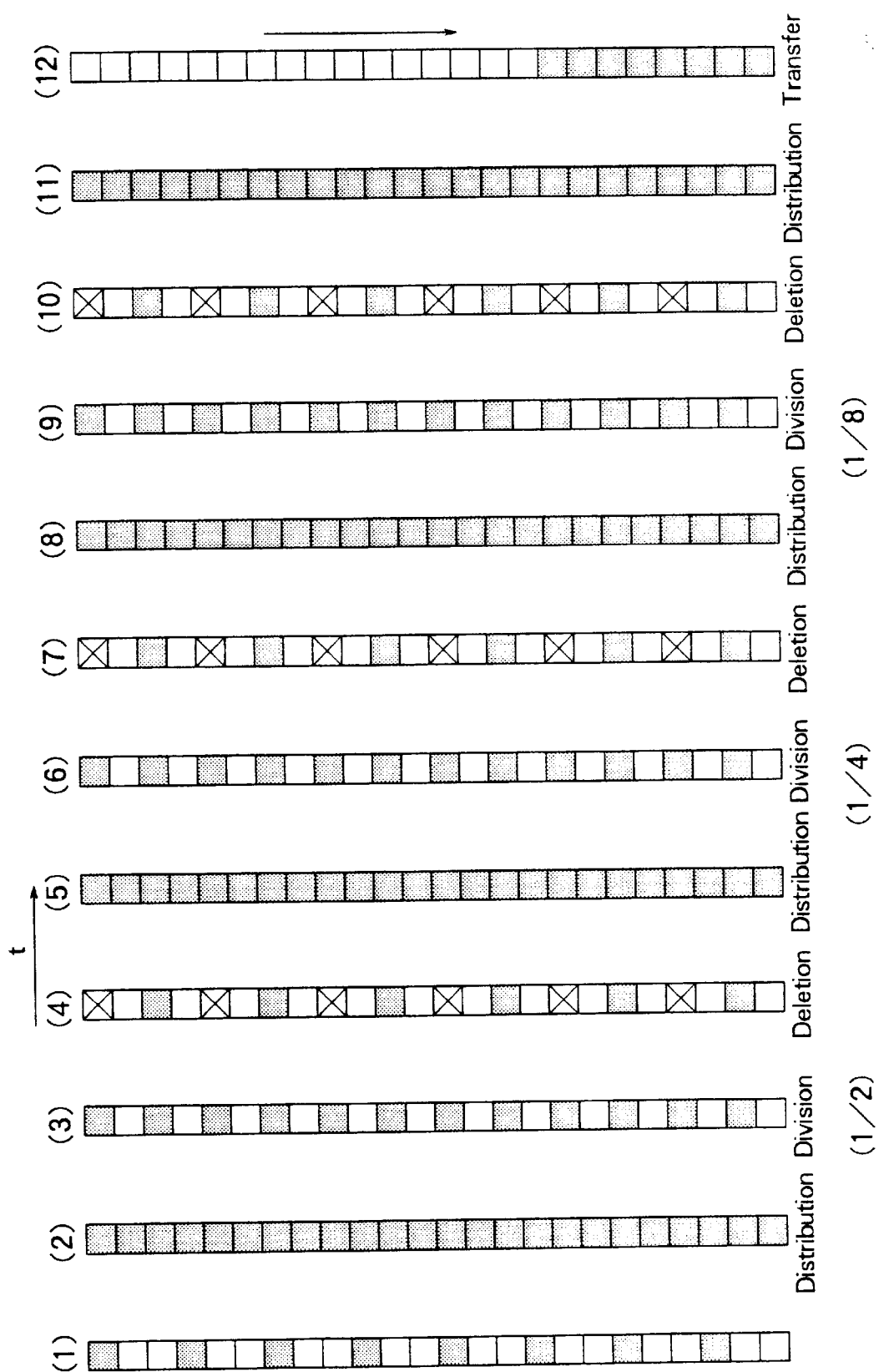
FIG. 18 is an illustration of steps of the attenuation processing of FIG. 14.
Figure 19:
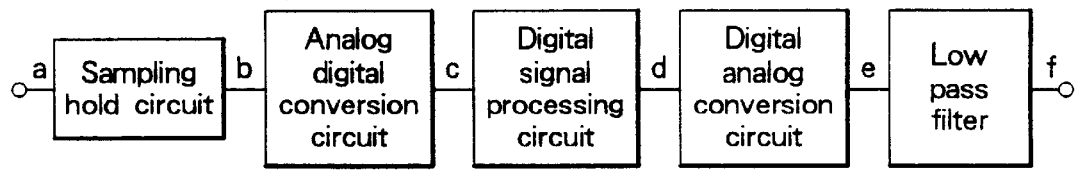
FIG. 19 is a block diagram illustrating the composition of the conventional digital filter system.
Figure 20:
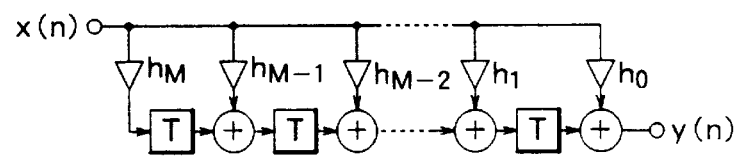
FIG. 20 is a composition diagram showing an example of conventional FIR (finite impulse response) type filter.
Figure 21:
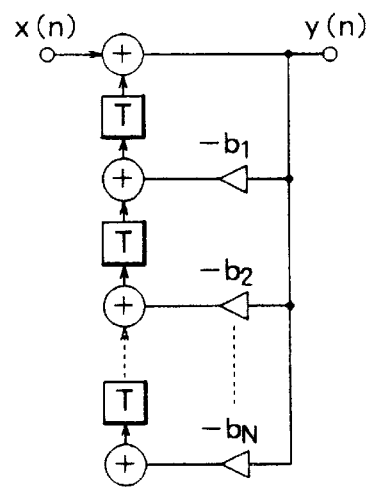
FIG. 21 is a composition diagram showing an example of conventional IIR (infinite impulse response) type filter.
Figure 22:
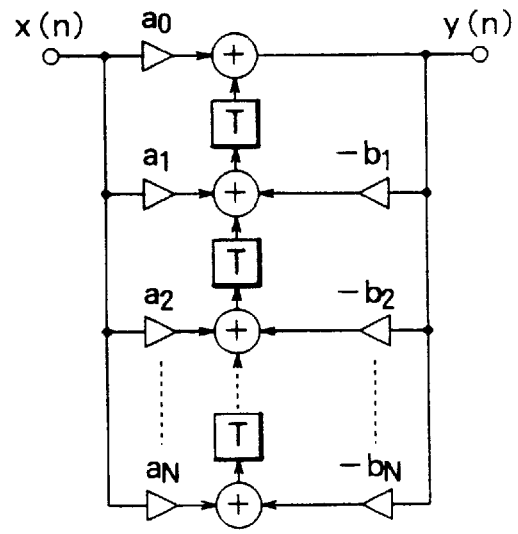
FIG. 22 is a composition diagram showing an example of filter combining the conventional FIR (finite impulse response) type filter and the conventional IIR (infinite impulse response) type filter.
Figure 23:
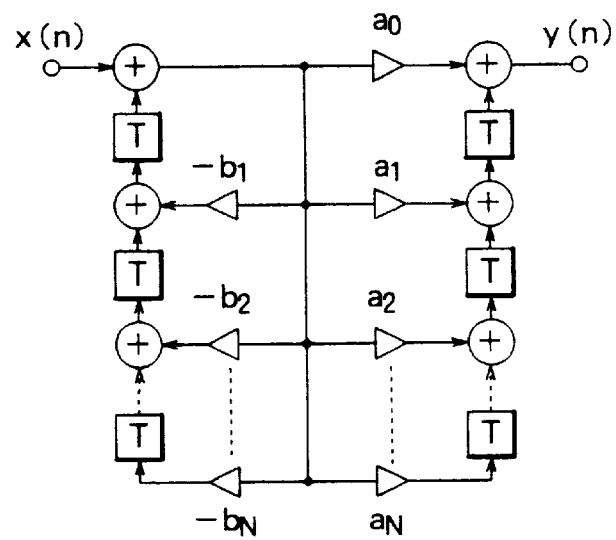
FIG. 23 is a composition diagram showing another example of filter combining the conventional FIR (finite impulse response) type filter and the conventional IIR (infinite impulse response) type filter.

Steps of this attenuation processing is as shown in FIG. 18. In this drawing, the hatched portion indicates the disposition of the potential well formation site, while in the transfer process shown at the last (12) in this drawing, the output charge signal transfer is executed by the same operation as the CSD (charge sweep device), for this example.

In the process mentioned before, as the steps (2) and (4) may be executed in parallel, naturally, the step (2) can start for the next data during the execution of the step (4), so as to enable pipeline type processing.

In the description mentioned hereinbefore, it has been supposed that the charge packet supplied by the separate reference charge generation unit R delivering the reference signal to the MDAC is used as the reference signal for the AD conversion in the process of the step (3); however, it is evident that the reference signal may also be supplied from a reference charge generation unit R' common to all DA converters through the input shift register.

In this case, though the structure is rather complex, such composition will be extremely effective in respect of the processing accuracy control when a significant error exists in the produced charge amount among a plurality of reference charge signal generation units R.

As it is evident from the description mentioned hereinbefore, according to the present invention, as the charge transfer device represented by the charge-coupled device CCD is used as signal processor and no part uses electric current for signal, it is known that the power consumption is reduced to the minimum.

The present application realizes a high-performance filter apparatus operating with a very low power consumption by adopting such charge transfer device for the most of its composition.

What is claimed is:

1. A charge domain signal filter comprising:

at least one AD converter;

at least one reference charge supply unit;

a coefficient signal supply unit for supplying at least one digital coefficient signal;

a plurality of DA converters acting in said charge domain for receiving digital signal outputs supplied from said AD converter and said coefficient signal supply unit and for performing a multiplication type DA conversion to produce products using, as a reference signal, a reference charge packet generated by said reference charge supply unit; and an analog shift register circuit having a plurality of stages, said analog shift register circuit being operable to accumulatively add in said charge domain, at corresponding ones of said stages, said products to contents of preceding ones of said stages, respectively.

2. A charge domain signal filter according to claim 1, wherein an input signal is first converted by said AD converter, next supplied to said plurality of DA converters as input data and multiplied by both said at least one digital coefficient signal and said reference charge packet, respectively, to form analog charge signal products thereof, said analog charge signals being added in said charge domain by the corresponding stage of said analog shift register circuit to contents of a preceding stage of said shift register made available by a shift operation.

3. A charge domain signal filter according to claim 2, wherein a last stage of said analog shift register circuit adds an external input charge signal to an output of the preceding stage and provides the sum thereof as said input signal to said AD converter.

4. A charge domain signal filter according to claim 1, wherein said AD converter is composed of a charge transfer device.

5. A charge domain signal filter according to claim 4, wherein a charge coupled device is used as said charge transfer device.

6. A charge domain signal filter according to claim 4 or 5, wherein said plurality of DA converters includes (1) a first subset thereof for converting said digital signal outputs from said at least one AD converter to first analog charge packets according to second charge packets from a second subset of said plurality of DA converters and (2) said second subset for converting said at least one digital coefficient signal to said second charge packets according to said reference charge packet.

7. A charge domain signal filter according to claim 4 or 5, wherein said plurality of DA converters includes (1) a first subset thereof for converting a magnitude of said at least one digital coefficient signal to first charge packets according to said reference charge packet supplied from said reference charge supply unit; and (2) a second subset thereof for converting said digital signal outputs of said AD converter to second analog charge packets according to said first charge packets and a sign bit of said at least one digital coefficient.

8. A charge domain signal filter according to claim 4 or 5, wherein said at least one AD converter and said plurality of DA converters use, as a reference signal, a reference charge packet supplied from said reference charge supply unit.

9. A charge domain signal filter according to claim 3, further comprising a charge signal attenuation unit connected between said last stage and said at least one AD converter.

10. A charge domain signal filter according to claim 2, wherein an output from digital signal sources such as a digital memory output or a digital operation unit output are supplied directly as an input to said plurality of DA converters in place of said at least one AD converter.

* * * * *